United States Patent
Cui et al.

(10) Patent No.: US 9,692,404 B2
(45) Date of Patent: Jun. 27, 2017

(54) POWER FACTOR CORRECTION CONTROLLING CIRCUIT AND DRIVING METHOD THEREOF

(71) Applicant: Magnachip Semiconductor, Ltd., Cheongju-si (KR)

(72) Inventors: Zhi Yuan Cui, Cheongju-si (KR); In Ho Hwang, Incheon (KR); Gyu Ho Lim, Cheongju-si (KR); Young Gi Ryu, Seoul (KR); Jun Sik Min, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/969,375

(22) Filed: Dec. 15, 2015

(65) Prior Publication Data

US 2016/0218704 A1    Jul. 28, 2016

(30) Foreign Application Priority Data

Jan. 22, 2015    (KR) .................. 10-2015-0010734

(51) Int. Cl.
*H03K 7/08* (2006.01)
*H02M 1/42* (2007.01)

(52) U.S. Cl.
CPC ............ *H03K 7/08* (2013.01); *H02M 1/4225* (2013.01); *Y02B 70/126* (2013.01)

(58) Field of Classification Search
CPC ............................... H03K 7/08; H02M 1/4225
USPC ......................................................... 327/175
See application file for complete search history.

(56) References Cited

U.S. PATENT DOCUMENTS

| | | | | |
|---|---|---|---|---|
| 5,565,761 A * | 10/1996 | Hwang | ............... | H02M 1/4208 323/222 |
| 5,592,128 A * | 1/1997 | Hwang | ................... | G05F 1/613 323/288 |
| 5,757,635 A * | 5/1998 | Seong | ................. | H02M 1/4225 323/222 |
| 6,104,172 A * | 8/2000 | Josephs | ..................... | G05F 1/70 323/207 |
| 6,946,819 B2 * | 9/2005 | Fagnani | ............. | H02M 1/4225 323/207 |
| 8,242,755 B2 * | 8/2012 | Park | ........................ | H02M 1/36 323/222 |
| 8,614,595 B2 * | 12/2013 | Acatrinei | ............ | H02M 1/4208 327/172 |
| 9,059,635 B2 * | 6/2015 | Chu | ................... | H05B 33/0815 |
| 2011/0095732 A1 | 4/2011 | Park et al. | | |
| 2011/0221402 A1 * | 9/2011 | Park | ......................... | G05F 1/70 323/211 |

(Continued)

*Primary Examiner* — Ryan Jager
(74) *Attorney, Agent, or Firm* — NSIP Law

(57) ABSTRACT

A power factor correction controlling circuit includes a control signal providing circuit configured to provide a control signal associated with a feedback signal, the feedback signal being controlled based on a bias signal, a pulse width modulation signal controlling circuit configured to control a pulse width modulation signal based on one of first and second bias signals and a power factor controlling circuit configured to provide a power factor control signal when an amplitude of the pulse width modulation signal reaches that of the power factor control signal. Such a circuit Is able to operate stably, regardless of a load condition and an input voltage condition.

19 Claims, 5 Drawing Sheets

(56) References Cited

U.S. PATENT DOCUMENTS

2012/0313536 A1\* 12/2012 Kim .................. H05B 33/0818
                                                                                     315/186
2016/0181906 A1\*  6/2016 Gambetta ............. H02M 3/156
                                                                                     323/288

\* cited by examiner

POWER FACTOR CORRECTION CONTROLLING CIRCUIT AND DRIVING METHOD THEREOF

CROSS-REFERENCE TO RELATED APPLICATION(S)

This application claims the benefit under 35 USC 119(a) of Korean Patent Application No. 10-2015-0010734 filed on Jan. 22, 2015 in the Korean Intellectual Property Office, the entire disclosure of which is incorporated herein by reference for all purposes.

BACKGROUND

1. Field

The following description relates to a driving technology of a power factor correction controlling circuit. The following description also relates to a power factor correction controlling circuit and a corresponding driving method for stably controlling a power factor correction controlling circuit, regardless of a load condition and an input voltage condition.

2. Description of Related Art

In a circuit, a power factor indicates power delivery effectiveness. The power factor is represented as a division of real power being actually delivered by an apparent power, thereby indicating a product of effective values of a voltage and a current. When the voltage and the current correspond to sine waves in form, the power factor may be changed according to a phase difference of the sine waves and may be improved when the phase difference is relatively small between the sine waves. Therefore, generally, a power factor correction may indicate an operation for modifying an input current form into the sine wave form and thereby decreasing the phase difference between the voltage and the current of a power signal.

An alternative power factor correction controlling circuit generates a control signal after delaying an error amplifier output in a start-up operation. Also, such a power factor correction controlling unit forcibly decreases a level of an error amplification signal based on a load condition and an input voltage condition. The level of the error amplification signal may be maintained during a time being set through using a delay circuit. Then, when the start-up operation is completed, the error amplification signal is returned to a normal output voltage.

In such an approach, it takes a long time for the conventional power factor correction controlling circuit to operate in a start-up process because the load condition and the input voltage condition are considered and the delay circuit is used. Also, a circuit configuration of the power factor correction controlling circuit may be restricted in order to speed up a control response time in a start-up time process. When an output voltage reaches a constant level, but it is not to a sufficient level, an error in the power factor correction controlling circuit may occur during the start-up operation because of the output of an error amplifier. Also, the power factor correction controlling circuit may delay a stabilization time because a flat interval occurs in the operation of the delay circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to the present examples, a power factor correction controlling circuit and a corresponding driving method regulate an amplitude of an applied bias current to drive a circuit normally regardless of amplitude of an input voltage and a load condition.

Also, according to the present examples, a power factor correction controlling circuit and a corresponding driving method regulate an amplitude of an applied bias current to stabilize a control signal and to prevent an output overvoltage.

Further, according to the present examples, a power factor correction controlling circuit and driving method thereof operate normally in a start-up period without using an additional delay circuit.

In one general aspect, a power factor correction controlling circuit includes a control signal providing circuit configured to provide a control signal associated with a feedback signal, a pulse width modulation signal controlling circuit configured to control a pulse width modulation signal based on one of first and second bias signals, and a power factor controlling circuit configured to provide a power factor control signal in response to an amplitude of the pulse width modulation signal reaching that of the control signal.

The control signal providing circuit may receive the feedback signal and may compare the received feedback signal with a predetermined reference voltage to generate the control signal.

The control signal providing circuit may output a first control signal or a second control signal respectively having different amplitudes, according to the feedback signal.

The first control signal may have a relatively small and constant amplitude when compared with the second control signal.

The control signal providing circuit may output a first control signal in response to an amplitude of the feedback signal being less than a specific value and may output a second control signal in response to the amplitude of the feedback signal being equal to or greater than the specific value.

The amplitude of the first control signal may correspond to one over N times that of the second control signal, wherein N is a natural number that is equal to or greater than 2.

The first control signal may include control signals that form one or more steps and each of the steps may maintain a constant voltage.

The feedback signal may correspond to a power factor control signal provided in a previous feedback procedure.

The pulse width modulation signal controlling circuit may charge one of the first and second bias signals into a capacitive element and may generate the pulse width modulation signal.

An amplitude of the first bias signal may correspond to one over N times that of the second bias signal, wherein N is a natural number that is equal to or greater than 2.

The pulse width modulation signal controlling circuit may receive a first bias signal in response to an amplitude of the feedback signal being less than a specific value and may receive a second bias signal in response to an amplitude of the feedback signal being equal to or greater than the specific value.

The power factor controlling circuit may compare the pulse width modulation signal and the control signal to output the power factor control signal.

In another general aspect, a method of driving a power factor correction controlling circuit includes providing a control signal associated with a feedback signal, controlling a pulse width modulation signal based on one of first and second bias signals, and providing a power factor control signal when an amplitude of the pulse width modulation signal reaches that of the control signal.

The providing may include outputting a first control signal in response to an amplitude of the feedback signal being less than a specific value and outputting a second control signal in response to the amplitude of the feedback signal being equal to or greater than the specific value.

The controlling may include applying a first bias signal in response to an amplitude of the feedback signal being less than a specific value and applying a second bias signal in response to the amplitude of the feedback signal being equal to or greater than the specific value.

In another general aspect, a power factor correction controlling circuit includes a pulse width modulation signal controlling circuit configured to control a pulse width modulation signal based on one of first and second bias signals, and a power factor controlling circuit configured to provide a power factor control signal in response to an amplitude of the pulse width modulation signal reaching that of a control signal associated with a feedback signal.

The control signal may be provided by a control signal providing circuit configured to provide a control signal associated with a feedback signal.

The control signal providing circuit may receive the feedback signal and compares the received feedback signal with a predetermined reference voltage to generate the control signal.

The control signal providing circuit may output a first control signal or a second control signal respectively having different amplitudes, according to the feedback signal.

The first control signal may have a relatively small and constant amplitude when compared with the second control signal.

Examples propose a power factor correction controlling circuit and a corresponding driving method thereof that regulate an amplitude of an applied bias current to normally drive a circuit regardless of an amplitude of an input voltage and a load condition.

Examples also propose a power factor correction controlling circuit and a driving method thereof that regulate an amplitude of an applied bias current used to stabilize a control signal and prevent an output overvoltage.

Additionally, examples propose a power factor correction controlling circuit and a driving method thereof that operate normally in a start-up time period without using an additional delay circuit.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
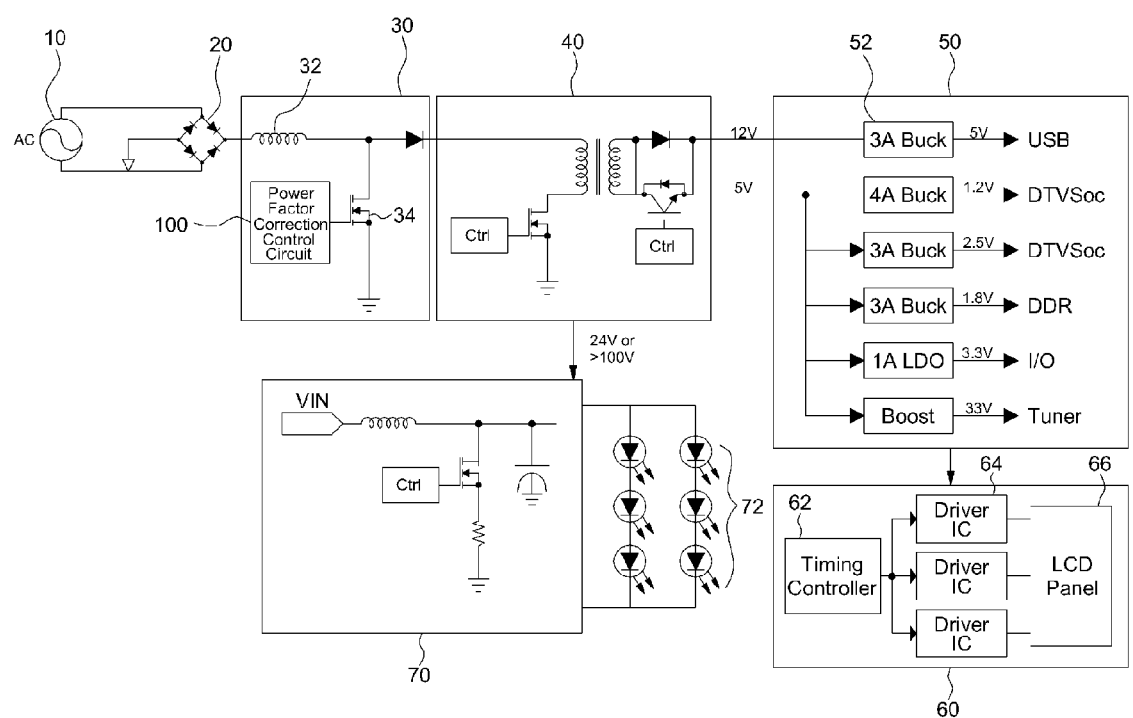
FIG. 1 is a block diagram illustrating a main circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

While terms such as "first," "second," and the like, are used to describe various components, such components are not to be understood as being limited to these terms. These terms are merely used to help the reader to distinguish one component from another.

It is to be understood that when an element is referred to as being "connected to" or "connected with" another element, the element is potentially directly connected to the other element or intervening elements are also potentially present. By contrast, when an element is referred to as being "directly connected to" another element, no intervening elements are intended to be present, except where the context makes it clear that other intervening elements are intended to be present. In addition, unless explicitly described to the contrary, the word "comprise" and variations such as "comprises" or "comprising," or synonyms such as "including" or "having," are to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms "a", "an" and "the" in the present disclosure are intended to include the plural forms as well, unless the context clearly indicates otherwise.

Devices that are in communication with each other are not required to be in continuous communication with each other, unless expressly specified otherwise. In addition, devices that are in communication with each other potentially communicate directly or indirectly with each other through one or more intermediaries.

Although process steps, method steps, algorithms, or the like, are described in a sequential order, such processes, methods and algorithms are potentially configured to work in alternate orders. In other words, any sequence or order of steps that is described does not necessarily indicate a requirement that the steps be performed in that order. Thus, the steps of the processes, methods or algorithms described herein are potentially performed in any order practical. Further, some steps are potentially performed simultaneously.

When a single device or article is described herein, it is intended to be readily apparent that more than one device or article is potentially used in place of a single device or article. Similarly, where more than one device or article is described herein, it is intended to be readily apparent that a single device or article is optionally used in place of the more than one device or article. The functionality or the features of a device are also potentially alternatively embodied by one or more other devices which are not explicitly described as having such functionality or features.

FIG. 1 is a block diagram illustrating a main circuit according to an example.

Referring to the example of FIG. 1, a main circuit includes an AC input power source 10, a bridge diode 20, a power factor circuit 30, a pulse width modulation circuit 40, a main board 50, a Liquid Crystal Display (LCD) module 60, a Light-Emitting Diode (LED) module 70 and a power factor correction controlling circuit 100.

In the example of FIG. 1, the AC input power source 10 corresponds to a source of an AC input voltage signal $V_{IN}$. In this example, the frequency of an AC input voltage $V_{IN}$ corresponds to, but is not necessarily limited to, about 50 Hz or 60 Hz according to a power supplier. However, a frequency of the AC input voltage signal $V_{IN}$ also optionally fluctuates according to a current distribution system.

In this example, the bridge diode 20 is electrically coupled to the AC input power source 10 and is configured by coupling a plurality of diode elements to each other. Also, the bride diode 20 full-wave rectifies the AC input voltage signal $V_{IN}$. Herein, the full-wave rectified AC input voltage $V_{IN}$ is provided to the power factor correction controlling circuit 100.

For example, the pulse width modulation circuit 40 is electrically coupled to the power factor correction circuit 30 and provides an adequate output current according to a frequency. The pulse width modulation circuit 40 modulates a pulse width according to an amplitude of an input signal applied from the power factor correction circuit 30. Also, the pulse width modulation circuit 40 controls a rising time of I/O current to provide a soft-start time.

In this example, the main board 50 is electrically coupled to the pulse width modulation circuit 40 and includes a plurality of converters 52. The plurality of converters 52 control an output voltage of the main board 50 by controlling an output voltage of the pulse width modulation circuit 40.

Thus, the LCD module 60 is electrically coupled to the main board 50 and includes a timing controller 62, a plurality of driving integrated circuits 64 and an LCD panel 66. The timing controller 62 processes a video data signal and provides a timing control signal to a plurality of driving integrated circuits 64 in order to drive the LCD panel 66.

The LED module 70 is electrically coupled to the pulse width modulation circuit 40 and includes a plurality of LEDs 72. The plurality of the LEDs 72 is configured to include N groups, each including series-coupled LEDs, parallel-coupled LEDs, and series-parallel coupled LEDs. The plurality of the LEDs 72 are driven by receiving a full-wave rectified AC input voltage $V_{IN}$ in the bridge diode 20.

The power factor correction controlling circuit 100 controls an operation of the switching element 34 coupled to the inductor 32 in the power factor correction circuit 30. The power factor correction controlling circuit 100 controls an operation of the switching element 34 in order to control a input current of the pulse width modulation circuit 40, because an input current of the pulse width modulation circuit 40 is determined according to an inductor current. In one example, the switching element 34 is implemented as a transistor. Hereinafter, in FIG. 2, a configuration of the power factor correction controlling circuit 100 is described further.

Figure 2:
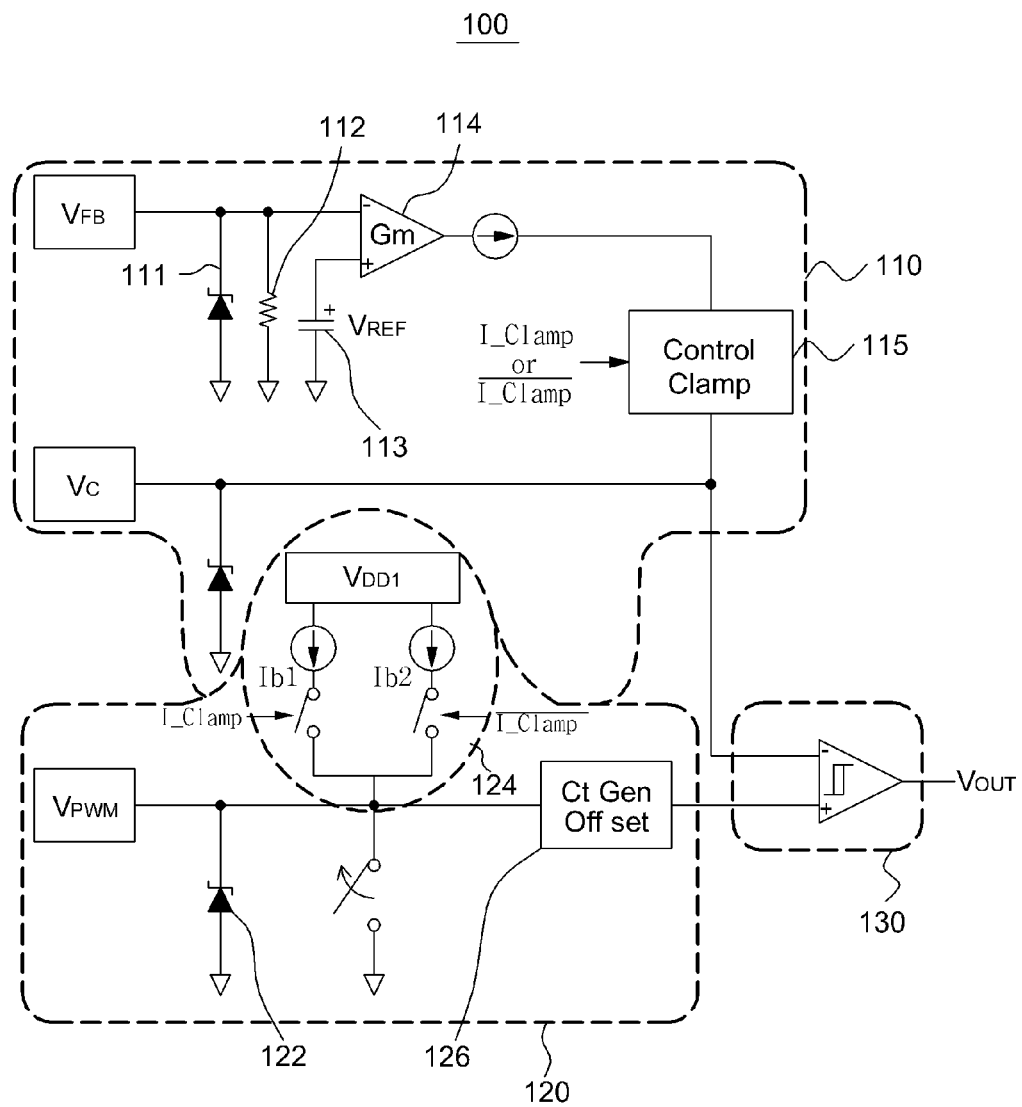
FIG. 2 is a block diagram illustrating a power factor correction controlling circuit in the example of FIG. 1.

FIG. 2 is a block diagram illustrating a power factor correction controlling circuit in the example of FIG. 1.

Referring to the example of FIG. 2, the power factor correction controlling circuit 100 includes a control signal providing unit 110, a pulse width modulation signal controlling unit 120, and a power factor controlling unit 130.

In this example, the control signal providing unit 110 includes a constant voltage element 111, a resistance element 112, a capacitive element 113, an operational amplifier 114 and a clamp module 115. For example, the control signal providing unit 110 provides a control signal $V_C$ associated with a feedback signal $V_{FB}$, the feedback signal $V_{FB}$ being controlled based on a bias signal. In further detail, the control signal providing unit 110 receives a feedback signal $V_{FB}$ from a feedback pin and the feedback pin is electrically coupled to an output terminal of the power factor correction controlling circuit 100. As a result, a feedback signal $V_{FB}$ corresponds to a power factor control signal $V_{OUT}$ provided in a previous feedback procedure. Meanwhile, a bias signal corresponds to a first or second bias signal $I_{b1}$, $I_{b2}$ that is selected in the previous feedback procedures. In one example, the constant voltage element 111 is implemented as a Zener diode.

The operational amplifier 114 compares a feedback voltage $V_{FB}$ in a feedback pin with a predetermined reference voltage $V_{REF}$, in order to provide an output to the clamp module 115. Herein, the predetermined reference voltage $V_{REF}$ is stored in the capacitive element 113.

In this example, the clamp module 115 is electrically coupled to the operational amplifier 114 and receives a first or second switching signal. In one example, the clamp module 115 outputs a first control signal when a feedback signal $V_{FB}$ is less than a specific value. Thus, a specific value of the feedback signal $V_{FB}$ is predetermined by a designer and changes according to a load condition. More specifically, the clamp module 115 receives a first switching signal I_Clamp when amplitude of a feedback signal $V_{FB}$ is less than a specific value. Hence, the clamp module 115 outputs a first control signal when such a first switching signal I_Clamp is received.

The clamp module 115 may receive a second switching signal $\overline{\text{I\_Clamp}}$ when an amplitude of a feedback signal $V_{FB}$ is equal to or greater than the specific value, and then the clamp module 115 outputs a second control signal corresponding to a load that is based on the output of the operational amplifier 114. Therefore, the control signal $V_C$ is controlled according to a value of a feedback signal $V_{FB}$ and the feedback voltage $V_{FB}$ is controlled according to a first or second bias signal $I_{b1}$, $I_{b2}$ that was selected in a previous feedback procedure and a control signal $V_C$ that was selected in the previous feedback procedure.

In this example, the pulse width modulation signal controlling unit 120 includes a constant voltage element 122, a bias signal applying module 124 and an offset voltage applying module 126. Also, the pulse width modulation signal controlling unit 120 controls a pulse width modulation signal $V_{PWM}$, based on one of the first and second bias signals $I_{b1}$, $I_{b2}$. More specifically, the pulse width modulation signal controlling unit 120 charges a capacitive element, not described in detail, that is based on one of the first and second bias signals $I_{b1}$, $I_{b2}$ and applies an offset voltage $V_{OFF}$ to generate a pulse width modulation signal $V_{PWM}$. Herein, the offset voltage level $V_{OFF}$ is much smaller than the level of the pulse width modulation signal $V_{PWM}$. A level of the pulse width modulation signal $V_{PWM}$ is increased by a very small amount by the offset voltage $V_{OFF}$, because the level of the offset voltage $V_{OFF}$ is negligible. In one example, an amplitude of the first bias signal $I_{b1}$ corresponds to one divided by a number, N, multiplied by the value of the second bias signal $I_{b2}$. In an example, N is a natural number that is equal to or more than 2, but is not necessarily limited to such a value. Put differently, the second bias signal $I_{b2}$ is N times larger than the first bias signal $I_{b1}$. Hence, the time of charging the capacitor by the second bias signal is faster than the charging time using first bias signal $I_{b1}$ by a factor of N. Therefore the pulse width of the pulse width modulation signal $V_{PWM}$ generated by the second bias signal $I_{b2}$ is smaller than the corresponding pulse with generated by the first bias signal $I_{b1}$, because the gradient of the pulse width modulation signal $V_{PWM}$ generated by the second bias signal $I_{b2}$ is larger than that of the pulse width modulation signal $V_{PWM}$ generated by the first bias signal $I_{b1}$. In one example, the constant voltage element 122 is implemented using a Zener diode.

In one example, the pulse width modulation signal controlling unit 120 applies a first bias signal $I_{b1}$ when an amplitude of the feedback signal $V_{FB}$ is less than a specific value and applies a second bias signal $I_{b2}$ when an amplitude of the feedback signal $V_{FB}$ is equal to or greater than the specific value. In this context, a specific value of the feedback signal, in an example, is predetermined appropriately by a designer and is changed according to a load condition. In further detail, the bias signal applying module 124 receives a first switching signal I_Clamp when an amplitude of a feedback signal $V_{FB}$ is less than the specific value. The bias signal applying module 124 receives the first switching signal I_Clamp to apply the first bias signal $I_{b1}$. Meanwhile, the bias signal applying module 124 receives a second switching signal $\overline{I\_Clamp}$ to apply the second bias signal $I_{b2}$ when amplitude of a feedback signal $V_{FB}$ is equal to or greater than the specific value. Also, in this example, the first switching signal and the second switching signal are the same signals as the first and second switching signals provided to the control signal providing unit 110. Put differently, the same first or second switching signals are provided to the control signal providing unit 110 and the pulse width modulation signal controlling unit 120, based on an amplitude of feedback signal $V_{FB}$.

Here, the offset voltage applying module 126 applies the offset voltage $V_{OFF}$ used for operating the switching element 34 of the power factor correction circuit 30, when the pulse width modulation voltage $V_{PWM}$ reaches the control voltage $V_C$.

In this example, the power factor controlling unit 130 is electrically coupled to the control signal providing unit 110 and the pulse width modulation signal controlling unit 120. As a result, the power factor controlling unit respectively receives a control signal $V_C$ and a pulse width modulation signal $V_{PWM}$. Thus, the power factor controlling unit 130 compares the control signal $V_C$ and the pulse width modulation signal $V_{PWM}$ in order to output the power factor control signal $V_{OUT}$. In one example, the power factor controlling unit 130 provides a power factor control signal $V_{OUT}$ when an amplitude of the pulse width modulation signal $V_{PWM}$ reaches the control signal $V_C$. Likewise, a power factor control signal $V_{OUT}$ is applied to a gate terminal of the switching element 34 in order to control an operation of the switching element 34. Furthermore, an output terminal of the power factor controlling unit 130 is electrically coupled to a feedback pin of the control signal providing unit 110 and the power factor controlling unit 130 provides a power factor control signal $V_{OUT}$ to a feedback pin.

Figure 3:
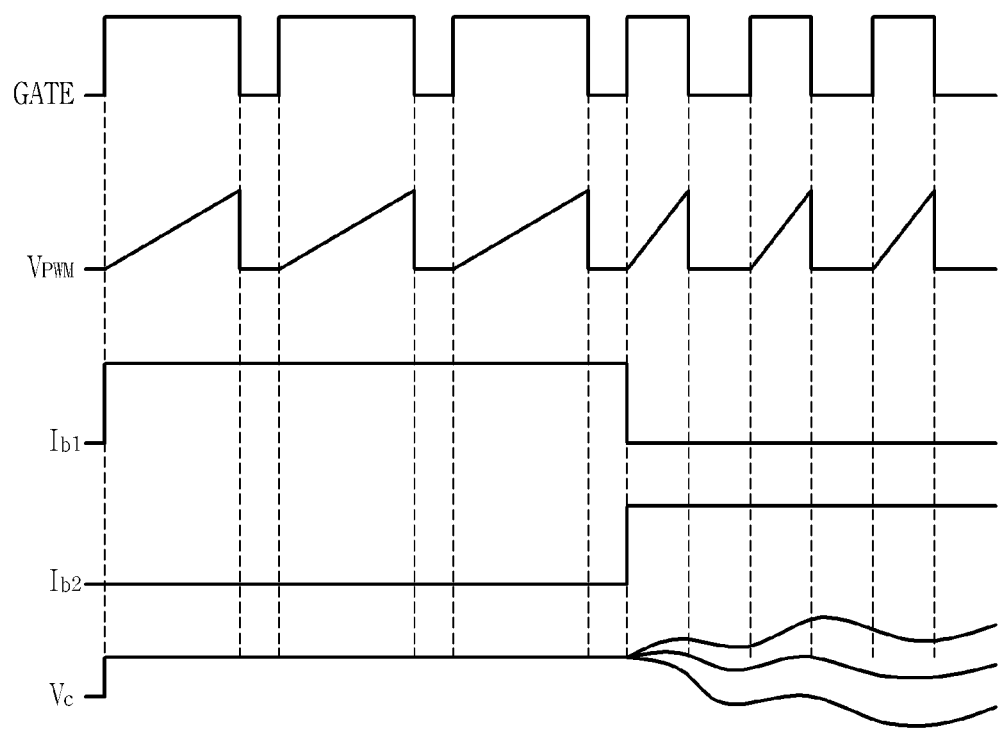
FIG. 3 is a waveform diagram illustrating an operation of a power factor correction controlling circuit in the example of FIG. 1.
Figure 4:
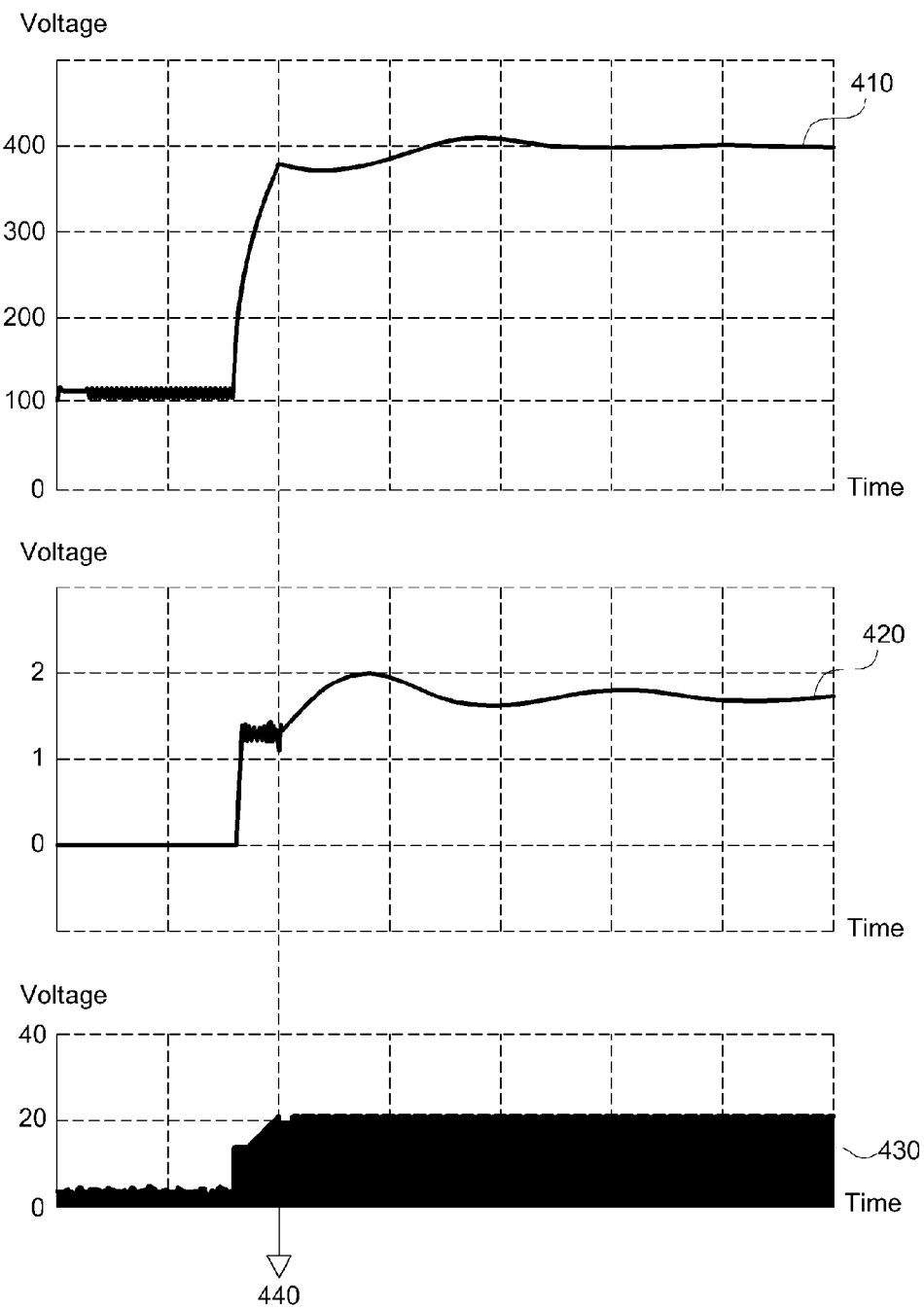
FIG. 4 is a waveform diagram illustrating an output of a power factor correction controlling circuit in the example of FIG. 1.

FIG. 3 is a waveform diagram illustrating an operation of a power factor correction controlling circuit in the example of FIG. 1 and FIG. 4 is a waveform diagram illustrating an output of a power factor correction controlling circuit in the example of FIG.

Referring to FIG. 3 and FIG. 4, the pulse width modulation signal controlling unit 120 charge one of the first and second bias signals $I_{b1}$, $I_{b2}$ into a capacitive element, not described in detail, and provides an offset voltage $V_{OFF}$ in order to generate the pulse width modulation signal $V_{PWM}$. The first and second bias signals $I_{b1}$, $I_{b2}$ are potentially charged into the capacitive element until the amplitude of the pulse width modulation signal $V_{PWM}$ reaches that of the control signal $V_C$. Therefore, because the amplitudes of the first and second bias signals $I_{b1}$, $I_{b2}$ are different, charging speeds of the respective capacitive elements are different and the respective pulse widths are different. For example, because the amplitude of a bias signal is proportional to an increased slope of the pulse width modulation signal $V_{PWM}$, the pulse width modulation signal $V_{PWM}$, in a time period when the first bias signal is applied, corresponds to a factor of one over N, compared to the increased slope of the pulse width modulation signal $V_{PWM}$ in a time when the second bias signal is applied. N is optionally a natural number that is 2 or greater, but potentially assumes different values, as discussed above. Therefore, the pulse width is controlled according to a variation of the increased slope of the pulse width modulation signal $V_{PWM}$ because a maximum amplitude of the pulse width modulation signal corresponds to that of the control signal $V_C$.

In one example, the control signal providing unit 110 outputs first and second control signals, each respectively having different amplitudes according to the feedback signal $V_{FB}$. Herein, the first control signal may be assumed to be controlled based on a feedback signal $V_{FB}$ in which the first bias signal $I_{b1}$ is applied in a previous feedback procedure and the second control signal is assumed to be controlled based on the feedback signal $V_{FB}$ in which the second bias signal $I_{b2}$ is applied in the previous feedback procedure. That is, the amplitude of the first control signal is relatively small and constant compared with that of the second control signal. In detail, the amplitude of the first control signal corresponds to one over N, where N is a natural number that is equal to or more than 2, times the amplitude of the second control signal. Therefore, the first control signal is controlled based on the first bias signals $I_{b1}$ and the pulse width is constantly maintained even though the input voltage $V_{IN}$ is very low. Therefore the power factor correction controlling circuit 100 may normally drive the power factor correction circuit 30 regardless of the amplitude of the input voltage $V_{IN}$ and the load condition.

In FIG. 4, the power factor controlling unit 130 compares the control signal $V_C$ with the pulse width modulation signal $V_{PWM}$ to output the power factor control signal $V_{OUT}$ 410, 100V/div. The power factor control signal $V_{OUT}$ is controlled by the first control signal before the power factor control signal $V_{OUT}$ reaches a predetermined specific value. Additionally, the power factor control signal $V_{OUT}$ is potentially controlled by the second control signal at the time when the power factor control signal $V_{OUT}$ reaches the predetermined specific value at a time 440. The control signal providing unit 110 provides the control signal $V_C$ that is controlled by the feedback signal, that is, the power factor control signal provided in a previous feedback procedure 420, 1V/div. In an example, the control signal providing unit 110 outputs the first control signal before the feedback signal $V_{FB}$ reaches the predetermined specific value and outputs the second signal when the feedback signal $V_{FB}$ reaches the predetermined specific value at the time 440. Therefore, in the section of applying the first control signal, the power factor control signal maintains a constant voltage and in the section of applying the second control signal the power factor control signal is stably controlled in response to the load condition. Thus, in such an example, the power factor control signal $V_{OUT}$ and the control signal $V_C$ start to normally operate when the drive signal 430, 20V/div, is applied.

In one example, the first control signal is implemented as a plurality of control signals, each being separate and not necessarily limited to a single control signal. The plurality of control signals potentially form N steps, where N is a natural number, and each of the N steps maintains a constant voltage. That is, the first control signal includes at least one of the steps and each of the steps maintains a constant voltage. Therefore, the plurality of control signals form the N steps before the power factor control signal $V_{OUT}$ reaches the predetermined specific value. Accordingly, in such an example, the amplitude of each of the plurality of control signals is less than that of the second control signal.

In one example, the power factor correction controlling circuit 100 controls the pulse width based on the first or second bias signal $I_{b1}$, $I_{b2}$, as selected in a previous feedback procedure. Additionally, the power factor correction controlling circuit 100 generates the control signal $V_C$ based on the feedback signal $V_{FB}$. Therefore, the control voltage $V_C$ is stably controlled in response to the load condition when the power factor control signal $V_{OUT}$ reaches a predetermined specific value, and additionally the power factor control signal $V_{OUT}$ does not generate an overvoltage. Also, in this example, the power factor correction controlling circuit 100 stably operates in a start-up period without using an additional delay circuit.

Figure 5:
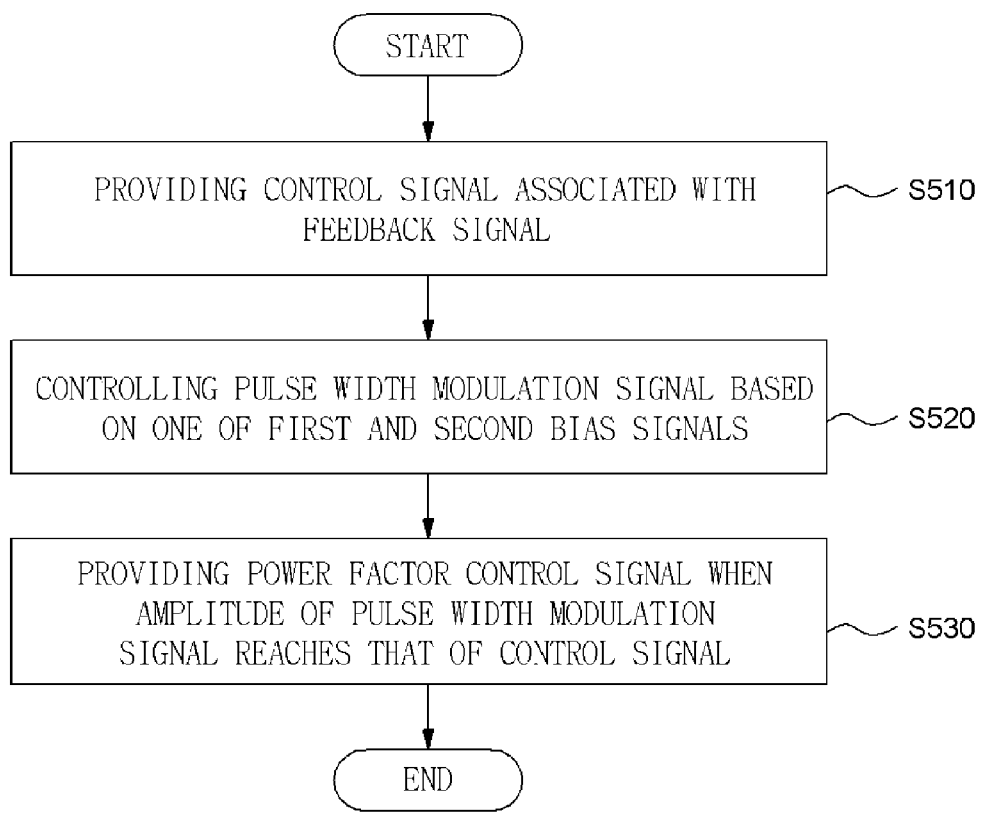
FIG. 5 is a flowchart illustrating a driving method of a power factor correction controlling circuit according to an example.

FIG. 5 is a flowchart illustrating a driving method of a power factor correction controlling circuit according to an example.

In step S510, the control signal providing unit 110 provides a control signal $V_C$ associated with a feedback signal $V_{FB}$ controlled based on a bias signal. For example, the feedback signal $V_{FB}$ corresponds to a power factor control signal $V_{OUT}$ provided in a previous feedback procedure. Also, in an example, the bias signal corresponds to a first or a second bias signal $I_{b1}$, $I_{b2}$ selected in a previous feedback procedure. The operational amplifier 114 compares a feedback voltage $V_{FB}$ in a feedback pin with a predetermined reference voltage $V_{REF}$ to generate the control signal $V_C$.

In step S520, the pulse width modulation signal controlling unit 120 controls a pulse width modulation signal $V_{PWM}$ based on one of first and second bias signals $I_{b1}$, $I_{b2}$. For example, the pulse width modulation signal controlling unit 120 charges one of the first and second bias signals $I_{b1}$, $I_{b2}$ into a capacitive element, not described in detail, and applies an offset voltage $V_{OFF}$ to generate the pulse width modulation signal $V_{PWM}$. In one example, an amplitude of the first bias signal $I_{b1}$ corresponds to one over N, for an N value that corresponds to the second bias signal $I_{b2}$. Also, in one example, the first bias signal $I_{b1}$ is applied to the pulse width modulation signal controlling unit 120 when an amplitude of the feedback signal $V_{FB}$ is less than a specific value and the second bias signal $I_{b2}$ is applied to the pulse width modulation signal controlling unit 120 when the amplitude of the feedback signal $V_{FB}$ is equal to or more than the specific value.

In step S530, the power factor controlling unit 130 provides a power factor control signal in response to the amplitude of the pulse width modulation signal $V_{PWM}$ reaching that of the control signal $V_C$. The outputted power factor control signal $V_{OUT}$ is applied to a gate terminal of the switching element 34 in the power factor correction circuit 30 to control an operation of the switching element 34.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power factor correction controlling circuit comprising:
   a control signal providing circuit configured to provide a control signal associated with a feedback signal;
   a pulse width modulation signal controlling circuit configured to control a pulse width modulation signal based on one of first and second bias signals; and
   a power factor controlling circuit configured to provide a power factor control signal in response to an amplitude of the pulse width modulation signal reaching an amplitude of the control signal,
   wherein the control signal providing circuit is further configured to receive the feedback signal and compare the received feedback signal with a predetermined reference voltage to generate the control signal.

2. The power factor correction controlling circuit of claim 1, wherein the control signal providing circuit is further configured to output a first control signal or a second control signal respectively having different amplitudes, according to the feedback signal.

3. The power factor correction controlling circuit of claim 2, wherein the amplitude of the first control signal is relatively smaller and more constant than the amplitude of the second control signal.

4. The power factor correction controlling circuit of claim 2, wherein the control signal providing circuit is further configured to output a first control signal in response to an amplitude of the feedback signal being less than a specific value and output a second control signal in response to the amplitude of the feedback signal being equal to or greater than the specific value.

5. The power factor correction controlling circuit of claim 4, wherein the amplitude of the first control signal corresponds to a quotient of the second control signal divided by N, wherein N is a natural number that is equal to or greater than 2.

6. The power factor correction controlling circuit of claim 4, wherein the first control signal comprises control signals that form one or more steps and each of the steps maintains a constant voltage.

7. The power factor correction controlling circuit of claim 1, wherein the feedback signal corresponds to a power factor control signal provided in a previous feedback procedure.

8. The power factor correction controlling circuit of claim 1, wherein the pulse width modulation signal controlling circuit is further configured to charge a capacitive element with one of the first and second bias signals and generate the pulse width modulation signal.

9. The power facto correction controlling circuit of claim 8, wherein an amplitude of the first bias signal corresponds to a quotient of the second bias signal divided by N, wherein N is a natural number that is equal to or greater than 2.

10. The power factor correction controlling circuit of claim 8, wherein the pulse width modulation signal controlling circuit is further configured to receive a first bias signal in response to an amplitude of the feedback signal being less than a specific value and receive a second bias signal in response to an amplitude of the feedback signal being equal to or greater than the specific value.

11. The power factor correction controlling circuit of claim 1, wherein the power factor controlling circuit is further configured to compare the pulse width modulation signal to the control signal and output the power factor control signal.

12. A method of driving a power factor correction controlling circuit, comprising:
providing a control signal associated with a feedback signal;
controlling a pulse width modulation signal based on one of first and second bias signals; and
providing a power factor control signal based on comparing an amplitude of the pulse width modulation signal to an amplitude of the control signal,
wherein the providing the control signal comprises receiving the feedback signal and comparing the received feedback signal with a predetermined reference voltage to generate the control signal.

13. The method of claim 12, wherein the providing comprises outputting a first control signal in response to an amplitude of the feedback signal being less than a specific value and outputting a second control signal in response to the amplitude of the feedback signal being equal to or greater than the specific value.

14. The method of claim 12, wherein the controlling comprises applying a first bias signal in response to an amplitude of the feedback signal being less than a specific value and applying a second bias signal in response to the amplitude of the feedback signal being equal to or greater than the specific value.

15. A power factor correction controlling circuit comprising:
a pulse width modulation signal controlling circuit configured to control a pulse width modulation signal based on one of first and second bias signals;
a power factor controlling circuit configured to provide a power factor control signal in response to an amplitude of the pulse width modulation signal reaching an amplitude of a control signal associated with a feedback signal; and
a control signal providing circuit configured to output a first control signal or a second control signal respectively having different amplitudes, according to the feedback signal.

16. The power factor correction controlling circuit of claim 15, wherein the control signal providing circuit is further configured to provide the control signal associated with the feedback signal.

17. The power factor correction controlling circuit of claim 15, wherein the control signal providing circuit is further configured to receive the feedback signal and compare the received feedback signal with a predetermined reference voltage to generate the control signal.

18. The power factor correction controlling circuit of claim 15, wherein the control signal providing circuit is further configured to output the first control signal in response to an amplitude of the feedback signal being less than a specific value and to output the second control signal in response to the amplitude of the feedback signal being equal to or greater than the specific value.

19. The power factor correction controlling circuit of claim 15, wherein the first amplitude of the first control signal is relatively smaller and more constant than the second amplitude of the second control signal.

\* \* \* \* \*